(12) United States Patent
Ogino et al.

(10) Patent No.: US 9,970,099 B2
(45) Date of Patent: May 15, 2018

(54) SPUTTERING TARGET FOR MAGNETIC RECORDING MEDIUM, AND PROCESS FOR PRODUCING SAME

(71) Applicant: JX Nippon Mining & Metals Corporation, Tokyo (JP)

(72) Inventors: Shin-Ichi Ogino, Ibaraki (JP); Yuichiro Nakamura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 694 days.

(21) Appl. No.: 14/383,219

(22) PCT Filed: Mar. 1, 2013

(86) PCT No.: PCT/JP2013/055672
§ 371 (c)(1),
(2) Date: Sep. 5, 2014

(87) PCT Pub. No.: WO2013/133163
PCT Pub. Date: Sep. 12, 2013

(65) Prior Publication Data
US 2015/0027882 A1    Jan. 29, 2015

(30) Foreign Application Priority Data
Mar. 9, 2012 (JP) .................................. 2012-053785

(51) Int. Cl.
*C23C 14/34* (2006.01)
*C22C 19/07* (2006.01)
(Continued)

(52) U.S. Cl.
CPC .......... *C23C 14/3414* (2013.01); *C22C 19/07* (2013.01); *C22F 1/10* (2013.01); *G11B 5/851* (2013.01); *Y10T 29/4998* (2015.01)

(58) Field of Classification Search
CPC ....... C22C 19/07; C22F 1/10; C23C 14/3414; G11B 5/851; Y10T 29/4998
(Continued)

(56) References Cited

U.S. PATENT DOCUMENTS 5,282,946 A * 2/1994 Kinoshita ................. C22C 5/04
148/674
5,334,267 A    8/1994 Taniguchi
(Continued)

FOREIGN PATENT DOCUMENTS

JP    H06-041735 A    2/1994
JP    2001-26860 A    1/2001
(Continued)

*Primary Examiner* — Rodney G McDonald
(74) *Attorney, Agent, or Firm* — Howson & Howson LLP

(57) ABSTRACT

A sputtering target for a magnetic recording medium, wherein an average grain area of a B-rich phase is 90 μm² or less. A process for producing a sputtering target for a magnetic recording medium, wherein an alloy cast ingot is subject to heat treatment, thereafter subject to primary rolling which includes at least one pass of cold rolling, thereafter subject to secondary rolling, and machined to prepare a target. The obtained sputtering target for a magnetic recording medium has few cracks in the B-rich phase and has a high leakage flux density, and by using this target, it is possible to stabilize the discharge during sputtering, suppress arcing which occurs from cracks in the B-rich phase, and suppress the generation of particles.

12 Claims, 6 Drawing Sheets

(51) Int. Cl.
*C22F 1/10* (2006.01)
*G11B 5/851* (2006.01)

(58) Field of Classification Search
USPC .................................. 204/298.12, 298.13
See application file for complete search history.

(56) References Cited

U.S. PATENT DOCUMENTS

| | | |
|---|---|---|
| 5,468,305 A | 11/1995 | Uchida et al. |
| 6,406,600 B1 | 6/2002 | Takashima |
| 6,521,062 B1 | 2/2003 | Bartholomeuz et al. |
| 7,336,336 B2 | 2/2008 | Yoo et al. |
| 7,909,949 B2 | 3/2011 | Nakamura et al. |
| 7,927,434 B2 | 4/2011 | Nakamura et al. |
| 8,568,576 B2 | 10/2013 | Sato |
| 8,679,268 B2 | 3/2014 | Ogino et al. |
| 2005/0274221 A1 | 12/2005 | Ziani et al. |
| 2005/0277002 A1 | 12/2005 | Ziani et al. |
| 2007/0017803 A1 | 1/2007 | Ziani et al. |
| 2009/0242393 A1 | 10/2009 | Satoh |
| 2011/0247930 A1 | 10/2011 | Sato |
| 2011/0284373 A1 | 11/2011 | Sato et al. |
| 2012/0118734 A1 | 5/2012 | Sato et al. |
| 2012/0241316 A1 | 9/2012 | Arakawa |
| 2013/0001079 A1 | 1/2013 | Sato |
| 2013/0015061 A1 | 1/2013 | Sato |
| 2013/0112555 A1 | 5/2013 | Ogino et al. |
| 2013/0134038 A1 | 5/2013 | Sato et al. |
| 2013/0175167 A1 | 7/2013 | Ikeda et al. |
| 2013/0206592 A1 | 8/2013 | Arakawa et al. |
| 2013/0213802 A1 | 8/2013 | Sato et al. |
| 2013/0213804 A1 | 8/2013 | Arakawa et al. |
| 2013/0220804 A1 | 8/2013 | Arakawa et al. |
| 2013/0341184 A1 | 12/2013 | Morishita et al. |
| 2014/0001038 A1 | 1/2014 | Ogino et al. |

FOREIGN PATENT DOCUMENTS

| | | |
|---|---|---|
| JP | 2001-98360 A | 4/2001 |
| JP | 2001-181832 A | 7/2001 |
| JP | 2005-146290 A | 6/2005 |
| JP | 2008-023545 A | 2/2008 |
| WO | 2013/001943 A1 | 1/2013 |

* cited by examiner

SPUTTERING TARGET FOR MAGNETIC RECORDING MEDIUM, AND PROCESS FOR PRODUCING SAME

BACKGROUND

The present invention relates to a sputtering target for a magnetic recording medium for use in the deposition of a magnetic thin film of a magnetic recording medium, particularly for use in the deposition of a magnetic recording layer of a hard disk adopting the vertical magnetic recording system, and to a process for producing such a sputtering target.

In the field of magnetic recording as represented with hard disk drives, materials based on Co, Fe or Ni, which are ferromagnetic metals, are used as materials of a magnetic thin film in a magnetic recording medium. As the recording layer of hard disks adopting the vertical magnetic recording system that has been put into practical use in recent years, used is a composite material configured from a Co—Cr-based, Co—Cr—Pt-based or Co—Pt-based ferromagnetic alloy having Co as its main component and nonmagnetic inorganic particles.

A magnetic thin film of a magnetic recording medium such as a hard disk is often produced by sputtering a ferromagnetic sputtering target made from foregoing materials via sputtering in light of its high productivity. A hard disk drive that is used as an external recording device is being demanded of a higher recording density year by year, and there are strong demands for reducing the particles that are generated during sputtering pursuant to the increase in the recording density.

With a sputtering target for a magnetic recording medium made from a Co—Pt—B-based alloy or a Co—Cr—Pt—B-based alloy, since a discharge will not occur during sputtering if the leakage flux density of the sputtering target is low, the voltage during sputtering needs to be increased when the leakage flux density is low. Meanwhile, if the voltage during sputtering is increased, there is a problem in that arcing is generated or the voltage becomes unstable, and the generation of particles during sputtering increases. Thus, under normal circumstances, cold rolling is performed to artificially introduce strain and thereby increase the leakage flux density.

However, when the Co—Pt—B-based alloy or the like is subject to cold rolling, there is a problem in that the brittle B-rich phase in the alloy is subject to brittle fracture, and cracks are generated. In addition, the cracked B-rich phase becomes the source of arcing during the sputtering process and causes the generation of particles, and deteriorates the production yield. In particular, when the area of the B-rich phase is large, since the stress concentration will increase by that much, the strength will deteriorate and the generation of cracks will increase even more.

Thus, considered may be preventing the cracks in the B-rich phase. Nevertheless, conventional technologies have no recognition of this problem, and do not propose any means for solving this problem.

For example, Patent Document 1 discloses a Co—Pt—B-based target containing $1 \leq B \leq 10$ (at. %) and a method for producing such a target. With this production method, hot rolling is performed at a temperature of 800 to 1100° C., and heat treatment is performed at 800 to 1100° C. for 1 hour or longer before the hot rolling process. Moreover, Patent Document 1 describes that, while hot rolling is difficult when B is contained, the generation of cracks of the ingot during hot rolling can be inhibited by controlling the temperature.

Nevertheless, Patent Document 1 does not in any way describe the problem of cracks in the B-rich phase, or the relation between the size and cracks of the B-rich phase.

Patent Document 2 discloses sputtering targets based on CoCrPt, CoCrPtTa, and CoCrPtTaZr containing B as an essential component. Patent Document 2 describes that, with this technology, the rolling properties can be improved by reducing the Cr—B-based intermetallic compound phase.

As the production method and production process, Patent Document 2 describes performing vacuum drawing at 1450° C., casting at a temperature of 1360° C., heating and holding at 1100° C. for 6 hours, and subsequently performing furnace cooling. Specifically, first time: heating at 1100° C. for 60 minutes, and thereafter rolling at 2 mm/pass, second time onward: heating at 1100° C. for 30 minutes, and thereafter rolling up to 5 to 7 mm for each pass.

Nevertheless, Patent Document 2 does not in any way describe the problem of cracks in the B-rich phase, or the relation between the size and cracks of the B-rich phase.

Patent Document 3 discloses a Co—Cr—Pt—C-based target, wherein carbides having an average crystal grain size of 50 μm or less exist in the matrix, and the carbides existing in the structure are dispersed when viewing the cross section of the target.

The object of this technology is to prevent the generation of coarse crystals and thereby suppress variations in the characteristics of the magnetic film. A Co—Cr—Pt—C-based material with large amounts of carbides containing C in an amount of 1 at % or more can be subject to hot rolling, enables the refinement of the crystal grain size and the dispersion of carbides, and suppresses variations in the film characteristics such as the coercive force.

Nevertheless, Patent Document 3 does not describe the problem of cracks in the B-rich phase and the solution thereof.

Patent Document 4 and Patent Document 5 respectively disclose Co—Cr—Pt—B—X1-X2-X3 and Co—Cr—Pt—B—Au—X1-X2. While Patent Document 4 and Patent Document 5 offer some description of attempting to improve the brittleness of B based on additives, the method is not very clear. Patent Document 4 and Patent Document 5 merely propose the foregoing compositions, and do not disclose a specific production method. Moreover, Patent Document 4 and Patent Document 5 do not describe the problem of cracks in the B-rich phase and the solution thereof.

Patent Document 6 discloses a sputtering target having a fine and uniform structure by improving the casting process and improving the rolling process of a Co—Cr—Pt—B-based alloy.

As the specific processes to be performed after casting, the ingot is subject to hot rolling at a rolling reduction of 1.33% and temperature of 1100° C. for each pass, and rolling is performed 48 times for causing the crystal grain size of the alloy to be 100 μm or less. The rolling rate in the foregoing case is 55% (rolling rate is roughly 45% to 65%). Nevertheless, Patent Document 6 does not describe the problem of cracks in the B-rich phase and the solution thereof.

Patent Document 7 describes producing a Cr—B target member as a sintered compact. Moreover, Patent Document 7 describes that, since the hard and brittle Cr—B intermetallic compound cracks easily and cannot be subject to plastic working, it is possible to produce a high density target, which is desirable as a target member, by producing the target member as a sintered compact. Nevertheless, Patent Document 7 does not describe the problem of cracks in the B-rich phase and the solution thereof.

Patent Document 8 discloses a Co—Cr—Pt—B-based alloy sputtering target comprising an island-shaped rolled structure made from a Co-rich phase based on the primary crystals during casting, wherein the hot rolling rate is set to 15% to 40%. Moreover, Patent Document 8 describes that, when the hot rolling rate is less than 15%, the dendritic structure cannot be destroyed, and segregation and residual stress cannot be sufficiently eliminated, and when the hot rolling rate exceeds 40%, the Co-rich phase and the B-rich phase become coarse when the processes of rolling and heat treatment are repeated. Nevertheless, Patent Document 8 does not describe the problem of cracks in the B-rich phase and the solution thereof.

Patent Document 9 describes a sputtering target containing B obtained via melting and casting, wherein the B content is 10 at % to 50 at %, remainder is one type among Co, Fe, and Ni, and the oxygen content is 100 wtppm or less. The object of this technology is to achieve a higher density in comparison to conventional powder sintered compact targets by considerably reducing the oxygen content. Nevertheless, Patent Document 9 does not describe the problem of cracks in the B-rich phase and the solution thereof.

PRIOR ART DOCUMENT

Patent Document

Patent Document 1: Japanese Patent Application Publication No. 2001-026860
Patent Document 2: Japanese Patent Application Publication No. 2001-181832
Patent Document 3: Japanese Patent Application Publication No. 2001-98360
Patent Document 4: Japanese Patent Application Publication No. 2006-4611
Patent Document 5: Japanese Patent Application Publication No. 2007-023378
Patent Document 6: Japanese Patent Application Publication No. 2008-23545
Patent Document 7: Japanese Patent Application Publication No. H6-41735
Patent Document 8: International Publication No. 2005/093124
Patent Document 9: International Publication No. 2011/070860

SUMMARY

As described above, when the Co—Pt—B-based alloy or the like is subject to cold rolling, there is a problem in that the brittle B-rich phase in the alloy is subject to brittle fracture, and cracks are generated. In addition, there is a problem in that the cracked B-rich phase becomes the source of arcing during the sputtering process and causes the generation of particles. In order to resolve this problem, considered may be producing the target without performing cold rolling. Nevertheless, since it is not possible to introduce strain into the target structure if cold rolling is not performed, there is a problem in that the leakage flux density cannot be increased.

In order to resolve the foregoing problems, as a result of intense study, the present inventors discovered that the stress concentration of the B-rich phase can be reduced by intentionally cracking the B-rich phase and separating the refined phase, and cracks in the B-rich phase during the cold rolling process can thereby be reduced.

Based on the foregoing discovery, the present invention provides:

1) A sputtering target for a magnetic recording medium, wherein an average grain area of a B-rich phase is 90 $\mu m^2$ or less;

2) The sputtering target for a magnetic recording medium according to 1) above, wherein the sputtering target is made from 1 to 26 at % of Pt, 1 to 15 at % of B, and remainder being Co and unavoidable impurities;

3) The sputtering target for a magnetic recording medium according to 1) above, wherein the sputtering target is made from 1 to 40 at % of Cr, 1 to 26 at % of Pt, 1 to 15 at % of B, and remainder being Co and unavoidable impurities;

4) The sputtering target for a magnetic recording medium according to 1) above, wherein the sputtering target is made from 1 to 40 at % of Cr, 1 to 15 at % of B, and remainder being Co and unavoidable impurities;

5) The sputtering target for a magnetic recording medium according to any one of 1) to 4) above, further containing one or more elements selected from Cu, Ru, Ta, and Nd in an amount of 1 at % or more and 10 at % or less;

6) The sputtering target for a magnetic recording medium according to any one of 1) to 5) above, wherein number of cracks in a B-rich phase is 2500 cracks/$mm^2$;

7) The sputtering target for a magnetic recording medium according to any one of 1) to 6) above, wherein the sputtering target has a maximum magnetic permeability ($\mu_{max}$) of 50 or less;

8) A process for producing a sputtering target for a magnetic recording medium, wherein an alloy cast ingot is subject to heat treatment, thereafter subject to primary rolling which includes at least one pass of cold rolling, thereafter subject to secondary rolling, and machined to prepare a target;

9) The process for producing a sputtering target for a magnetic recording medium according to 8) above, wherein the primary rolling is performed at a total rolling reduction of 10 to 90%;

10) The process for producing a sputtering target for a magnetic recording medium according to 8) or 9) above, wherein the secondary rolling is performed at a total rolling reduction of 1.0 to 10%; and 11) The process for producing a sputtering target for a magnetic recording medium according to any one of 8) to 10) above, wherein the sputtering target for a magnetic recording medium according to any one of 1) to 7) above is produced.

The present invention yields a superior effect of being able to provide a sputtering target for a magnetic recording medium that has few cracks in the B-rich phase and has a high leakage flux density. It is thereby possible to stabilize the discharge during sputtering, suppress arcing which occurs from cracks in the B-rich phase, and effectively prevent or suppress the generation of nodules or particles. Moreover, the present invention yields a superior effect of being able to form a high quality film and considerably improve the production yield.

DETAILED DESCRIPTION

Figure 1:
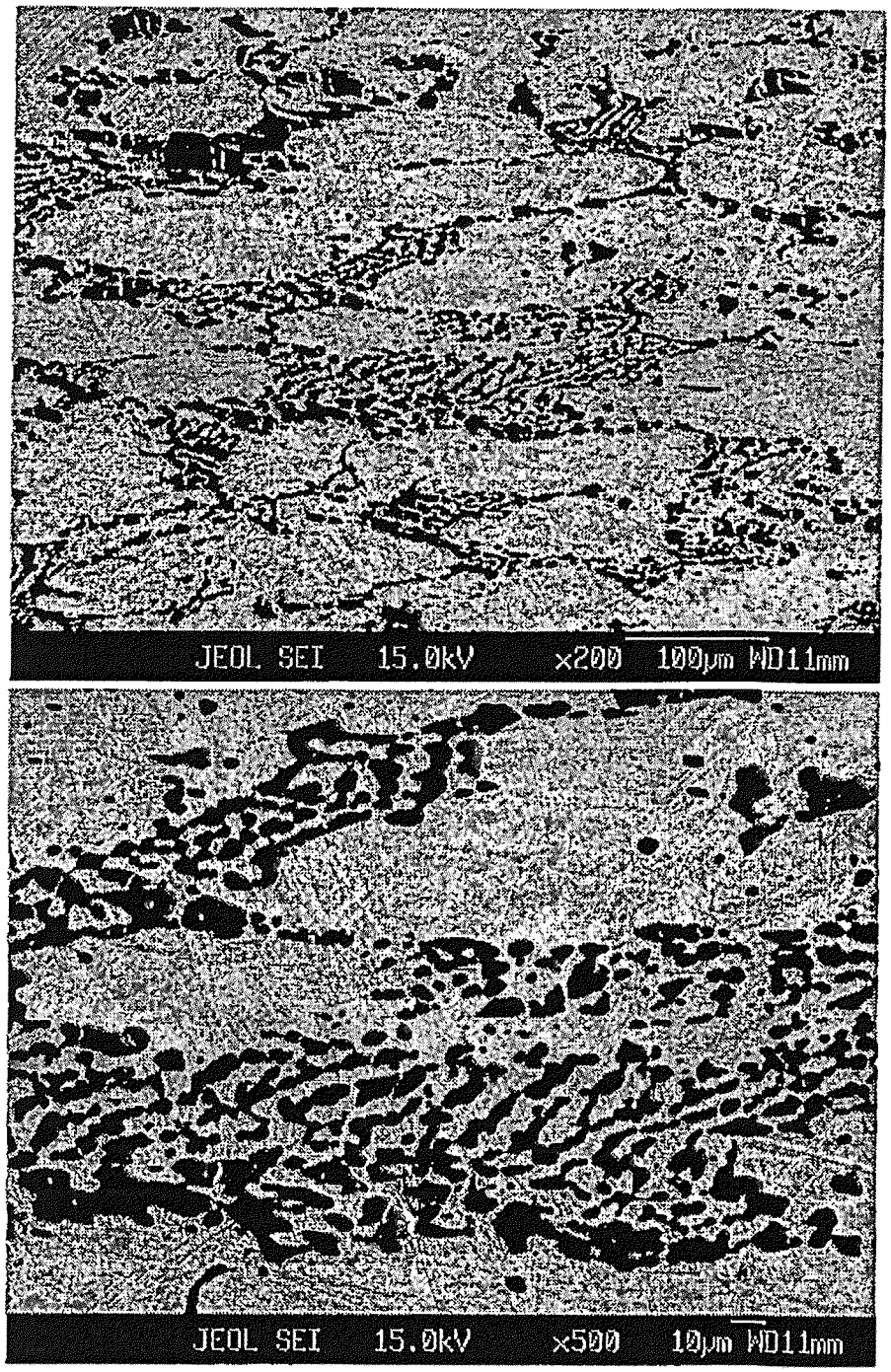
FIG. 1 is a photograph of the target of Example 1 and shows a representative example where the B-rich phase is finely separated (surface that is parallel to the sputtering surface; the lower diagram is an enlarged view of the upper diagram).
Figure 2:
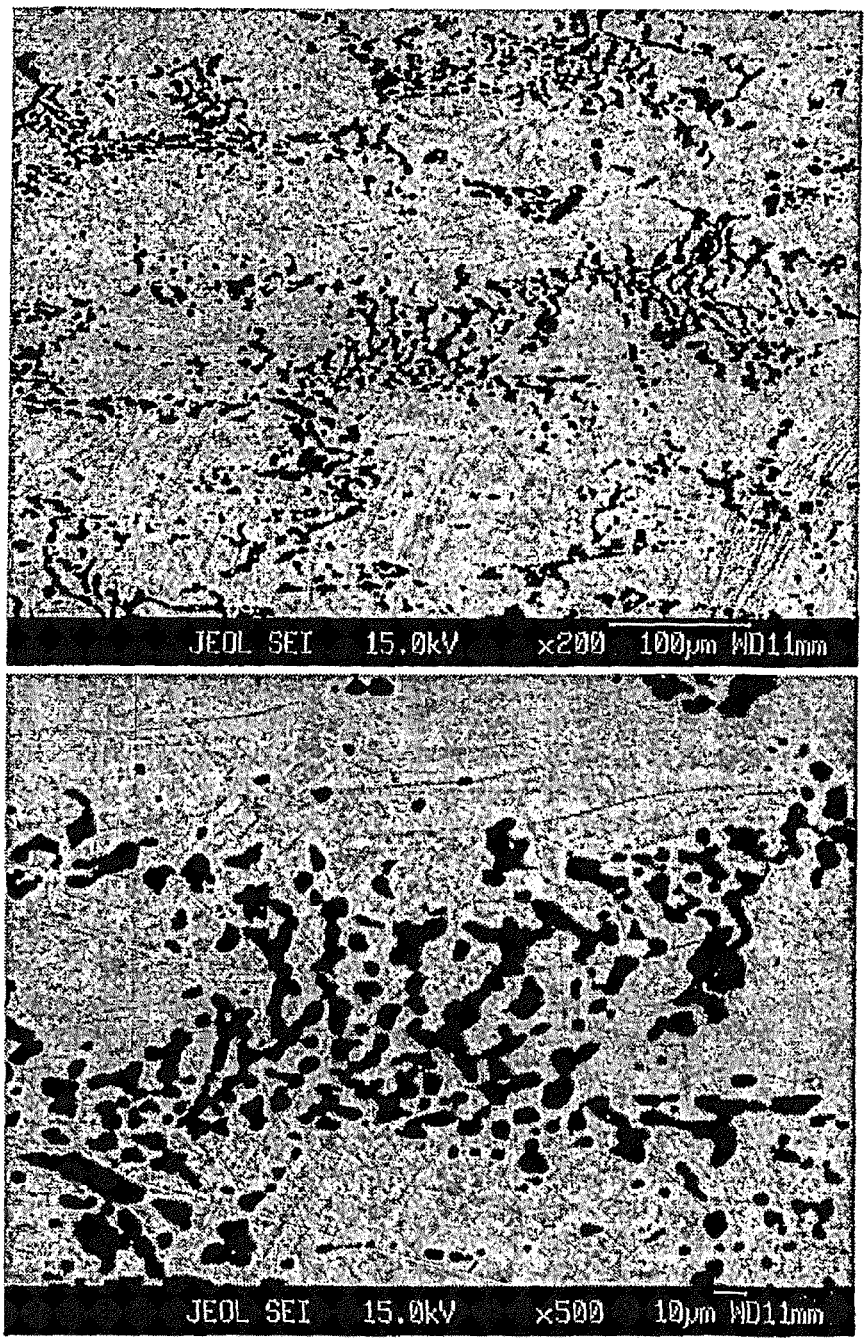
FIG. 2 is a photograph of the target of Example 2 and shows a representative example where the B-rich phase is finely separated (surface that is parallel to the sputtering surface; the lower diagram is an enlarged view of the upper diagram).
Figure 3:
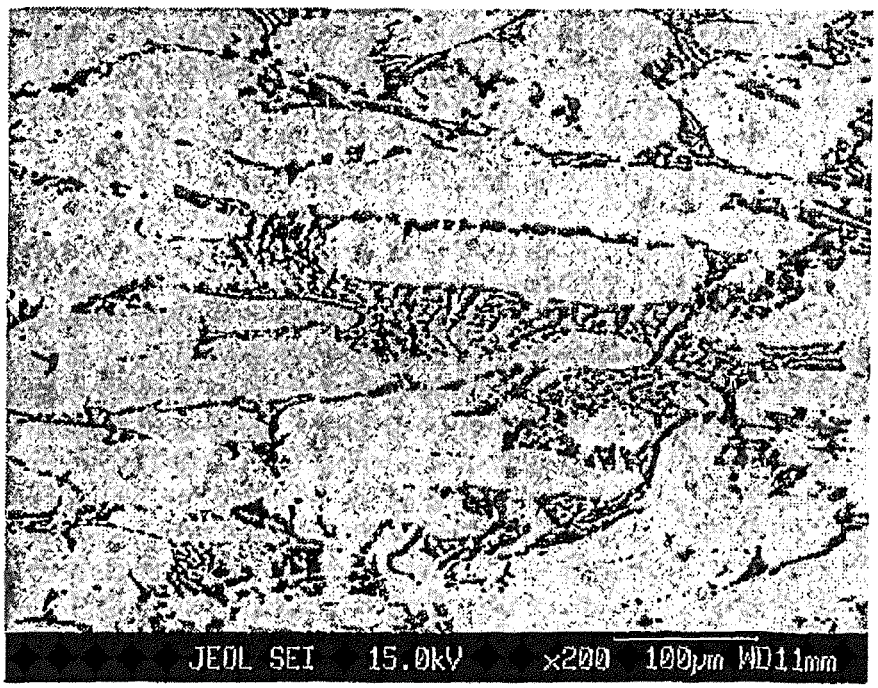
FIG. 3 is a photograph of the target of Example 4 and shows a representative example where the B-rich phase is finely separated (surface that is parallel to the sputtering surface; the lower diagram is an enlarged view of the upper diagram).
Figure 3:
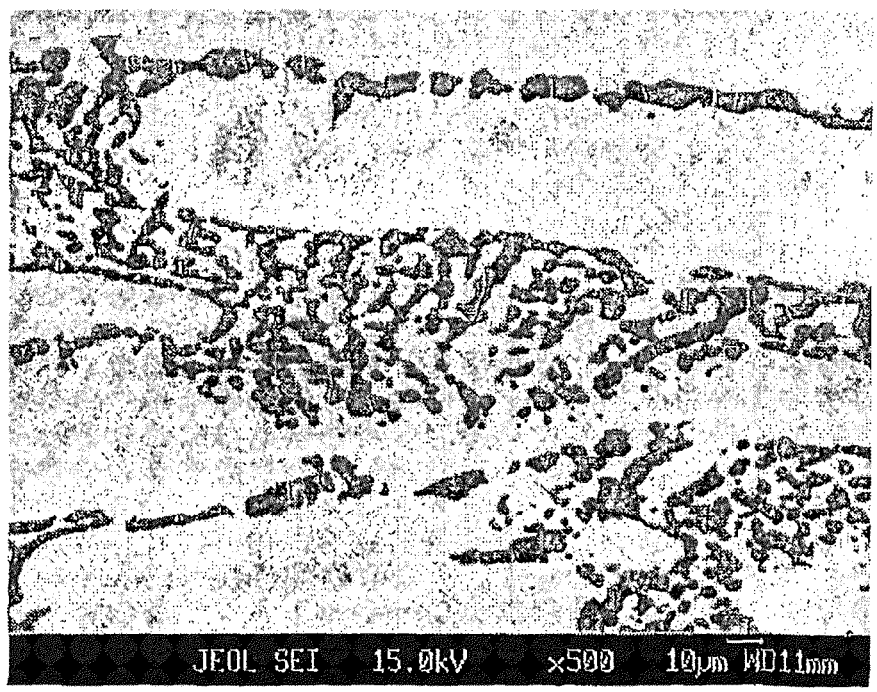
Figure 4:
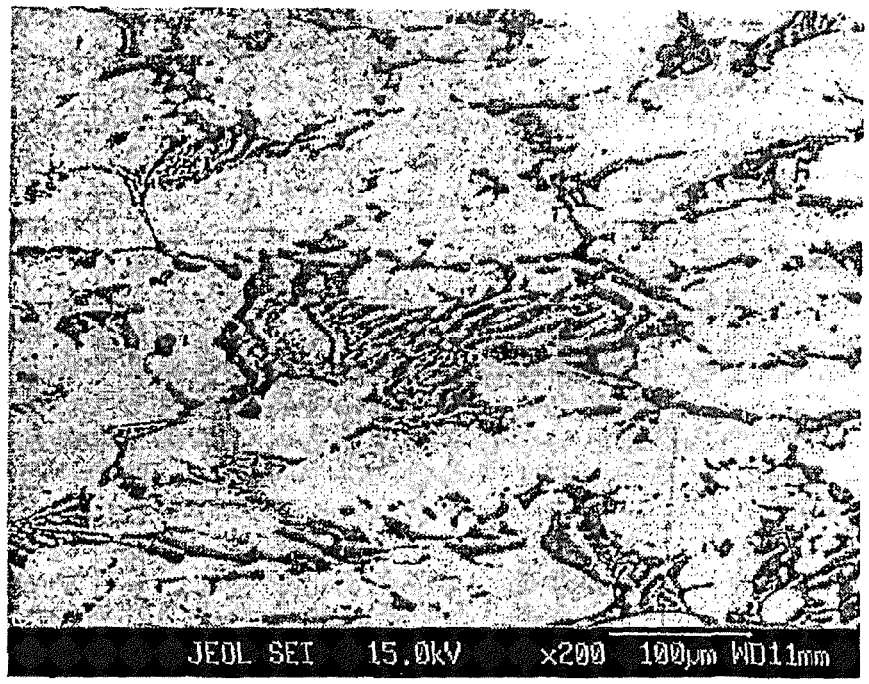
FIG. 4 is a photograph of the target of Comparative Example 1 and shows a representative example where the B-rich phase exists in a large state (surface that is parallel to the sputtering surface; the lower diagram is an enlarged view of the upper diagram).
Figure 4:
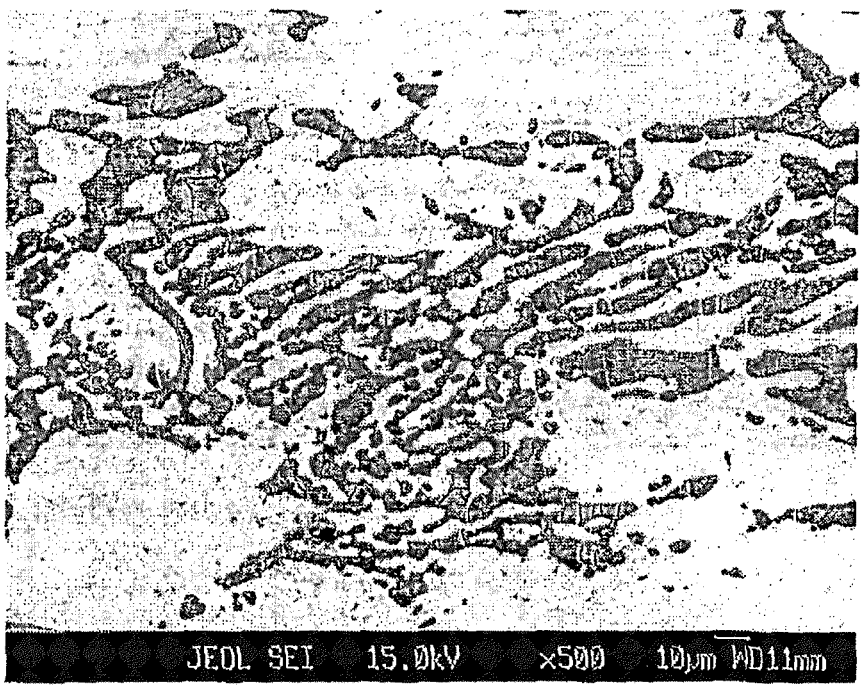
Figure 5:
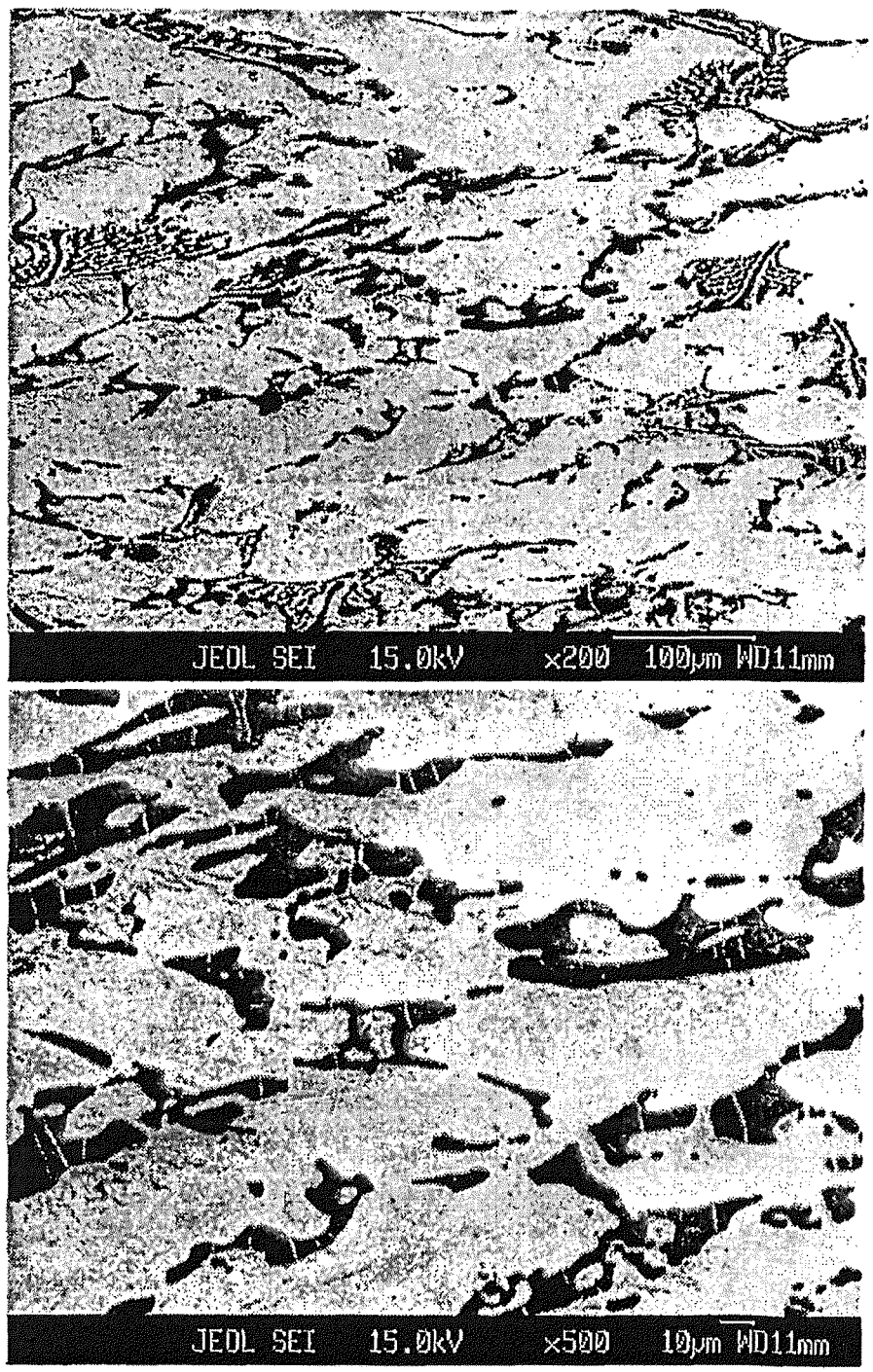
FIG. 5 is a photograph of the target of Comparative Example 2 and shows a representative example where the B-rich phase exists in a large state (surface that is parallel to the sputtering surface; the lower diagram is an enlarged view of the upper diagram).
Figure 6:
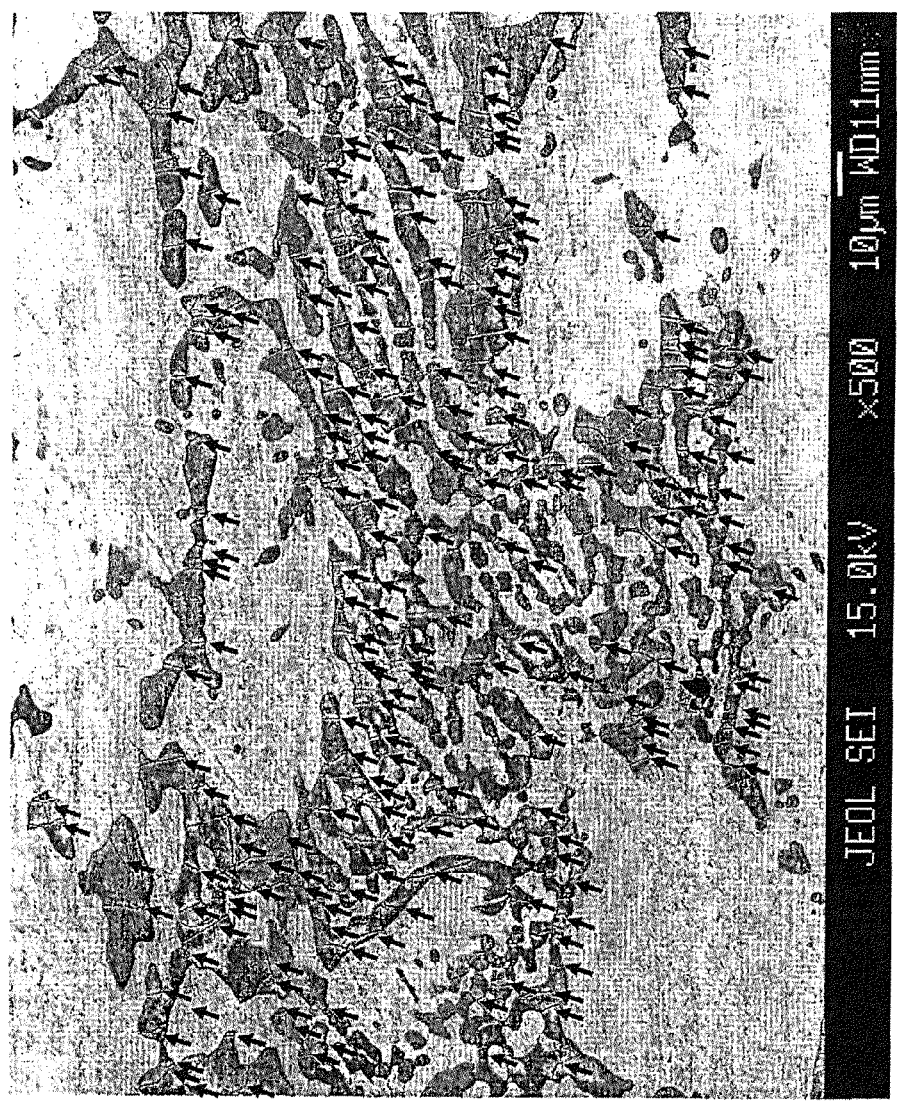
FIG. 6 is a photograph of the target of Comparative Example 1 and shows the cracks in the B-rich phase.

The present invention provides a sputtering target for a magnetic recording medium in which the average grain area of the B-rich phase is 90 $\mu m^2$ or less. The term "B-rich phase" referred to herein is an area containing more B than the peripheral area (matrix), and the area is separated into a matrix phase and a B-rich phase. While the shape and amount of the B-rich phase will change depending on the additive amount of B relative to the other metals of the alloy system, the B-rich phase often has a shape like cirrocumulus clouds (mackerel clouds, altocumulus clouds) as shown in FIG. 1 and FIG. 2 in the matrix.

When the grain area of the B-rich phase is large, the stress concentration during the cold rolling process will increase and, therefore, the strength will deteriorate and cracks in the B-rich phase will increase. Thus, as described later, by intentionally cracking the B-rich phase via cold rolling and finely separating the cracked B-rich phase via hot rolling, the grain area of the B-rich phase is reduced. Consequently, the B-rich phase will not crack easily even upon subsequently performing the cold rolling process for increasing the leakage flux density.

In the present invention, by causing the average grain area of the B-rich phase to be 90 $\mu m^2$ or less, it is possible to sufficiently prevent cracks in the B-rich phase caused by cold rolling. Specifically, the number of cracks in the B-rich phase in a 1 mm×1 mm area (visual field) is preferably 2500 cracks or less. It is thereby possible to effectively suppress the generation of arcing during sputtering.

The sputtering target for a magnetic recording medium of the present invention is configured from a Co—Pt—B-based alloy, a Co—Cr—Pt—B-based alloy or a Co—Cr—B-based alloy. While there is no limitation in the component composition of these alloys so as long as it is publicly known for use as a magnetic recording medium, preferably used is a Co—Pt—B-based alloy made from 1 to 26 at % of Pt, 1 to 15 at % of B, and remainder being Co and unavoidable impurities, preferably used is a Co—Cr—Pt—B-based alloy made from 1 to 40 at % of Cr, 1 to 26 at % of Pt, 1 to 15 at % of B, and remainder being Co and unavoidable impurities, and preferably used is a Co—Cr—B-based alloy made from 1 to 40 at % of Cr, 1 to 15 at % of B, and remainder being Co and unavoidable impurities.

In addition, in the present invention, one or more elements selected from Cu, Ru, Ta, and Nd may be added as additive elements in an amount of 1 at % or more and 10 at % or less in order to increase the leakage flux density.

The leakage flux density has a correlation with the maximum magnetic permeability. In other words, the leakage flux density will be higher as the maximum magnetic permeability is lower. In the present invention, when the maximum magnetic permeability is 50 or less, it is possible to obtain sufficient leakage flux density that will not cause an abnormal discharge.

As an effective means for increasing the leakage flux density, strain can be added to an alloy sheet for a magnetic recording medium via cold rolling, but when cold rolling is performed in a state where the area of the B-rich phase is large, the generation of cracks in the B-rich phase will increase. Thus, the focus of the present invention is to finely separate the B-rich phase before the cold rolling process as described above. It could be said that the technique for finely separating the B-rich phase did not conventionally exist. By finely refining the B-rich phase as described above, the number of cracks in the B-rich phase can be made to be 2500 cracks/$mm^2$.

The sputtering target for a magnetic recording medium of the present invention can be produced, for example, according to the following method.

Foremost, an alloy ingot based on Co—Pt—B or the like obtained via casting is subject to primary rolling which includes at least one pass of cold rolling. As primary rolling which includes at least one pass of cold rolling, there are, for example, the following combinations: 1) hot rolling—cold rolling—hot rolling, 2) hot rolling—cold rolling—hot rolling—hot rolling, 3) hot rolling—hot rolling—cold rolling—cold rolling—hot rolling, and so on.

There is no particular limitation on the number of times that rolling is performed, and so as long as the total rolling reduction is 10 to 90%, the number of times that rolling is performed may be suitably decided according to the intended thickness. Moreover, while there is no particular rule regarding order of rolling; for example, cold rolling→hot rolling, hot rolling→hot rolling, when a cast ingot obtained via casting is subject to cold rolling, there are cases where the ingot itself becomes cracked from the defects that were generated during the casting process. Thus, in order to remove such defects to a certain extent, hot rolling is preferably performed as the initial rolling process.

In the present invention, the total rolling reduction of cold rolling in the primary rolling is preferably set to 1% or more, and causing the total rolling reduction of hot rolling in the primary rolling to be 30% or more is extremely effective in separating the B-rich phase. Note that the term "total rolling reduction" as used herein refers to the total decreasing rate of the material thickness.

Subsequently, in order to increase the leakage flux density, secondary rolling is performed for the purpose of introducing strain into the structure. Secondary rolling is performed by repeating the cold rolling process. There is no particular limitation on the number of times that rolling is performed, and so as long as the total rolling reduction is 0.1 to 10%, the number of times that rolling is performed may be suitably decided according to the intended thickness and the intended leakage flux density. However, when the percentage content of Cr is high, it is not necessary to perform secondary rolling since the magnetic permeability will be low.

Conventionally, cracks would sometimes be generated in the B-rich phase due to the rolling that is performed for increasing the leakage flux density. Meanwhile, the leakage flux density was reduced as a measure for preventing the foregoing cracks, and the cracks in the B-rich phase were prevented by lowering the total rolling reduction during the secondary rolling process. Nevertheless, since the present invention can suppress the cracks in the B-rich phase by finely separating the B-rich phase in the alloy by performing primary rolling, which includes at least one pass of cold rolling, prior to performing secondary rolling, the present invention yields an extremely advantageous effect of not having to sacrifice the leakage flux density as with conventional technologies.

By cutting the rolled ingot obtained as described above into an intended shape and polishing the surface thereof, it is possible to produce the sputtering target for a magnetic recording medium of the present invention. The sputtering target for a magnetic recording medium produced as described above can cause the average grain area of the B-rich phase to be 90 μm², and is effective for causing the number of cracks in the B-rich phase to be 2500 cracks/mm², and preventing the generation of particles.

EXAMPLES

The present invention is now explained based on the Examples and Comparative Examples. Note that these Examples are merely illustrative, and the present invention is not in any way limited by these Examples. In other words, the present invention is limited only by the scope of claims, and covers the various modifications other than the Examples included in this invention.

Example 1

A Co—Cr—Pt—B alloy raw material made from 15 at % of Cr, 14.5 at % of Pt, 8 at % of B, and remainder being Co and unavoidable impurities was subject to radio frequency (vacuum) melting. The resulting product was cast using a mold, which is configured by cobalt being set on a copper surface plate, at a temperature between melting point and melting point +100° C. to obtain an ingot of 180×300×33t.

Subsequently, the obtained ingot was subject to primary rolling at a total rolling reduction of 62%. Here, the annealing temperature during the hot rolling was set to 1090° C. Subsequently, the obtained rolled material was subject to secondary rolling at a total rolling reduction of 5.0%. The resulting product was machined to obtain a target.

The surface parallel to the sputtering surface of this target was observed at ten arbitrary visual fields (areas) of 190 μm×240 μm using an FE-EPMA (model number: JXA-8500F) electron microscope manufactured by JEOL. Consequently, the average grain area of the B-rich phase was 77.7 μm². Moreover, the number of cracks in the B-rich phase was counted and, as a result of obtaining the average value thereof and normalizing the same, the number of cracks in the B-rich phase was 1600 cracks/mm². In addition, as a result of measuring the maximum magnetic permeability ($\mu_{max}$) in the horizontal direction relative to the sputtering surface of this target using a B—H meter (BHU-6020) manufactured by Riken Denshi, the maximum magnetic permeability ($\mu_{max}$) was 8.3.

TABLE 1

| | Target Composition Ratio (at. %) | Heat Treatment (Annealing) Temperature (° C.) | Total Rolling Reduction of Primary Rolling (%) | Total Rolling Reduction of Secondary Rolling (%) | Average Grain Area of B-rich Phase (μm²) | Cracks of B-rich Phase (crack/mm²) | Maximum Magnetic Permeability (μmax) |
|---|---|---|---|---|---|---|---|
| Example 1 | Co—15Cr—14.5Pt—8B | 1090 | 62 | 5.0% | 77.7 | 1600 | 8.3 |
| Example 2 | Co—15Cr—17.5Pt—8B | 1090 | 86 | 4.2% | 44.6 | 1500 | 8.3 |
| Example 3 | Co—15Cr—11Pt—12B | 1100 | 73 | 3.6% | 84.9 | 2000 | 11 |
| Example 4 | Co—14.5Cr—17Pt—8B | 1000 | 68 | 5.2% | 75.1 | 1100 | 8.9 |
| Example 5 | Co—14Cr—15.5Pt—10B | 1100 | 65 | 4.8% | 83.5 | 1900 | 11.8 |
| Example 6 | Co—14Cr—14Pt—6B | 800 | 80 | 3.2% | 74.3 | 900 | 10.6 |
| Example 7 | Co—15Cr—17.5Pt—7B | 900 | 78 | 3.9% | 50.1 | 1200 | 9.2 |
| Example 8 | Co—16Cr—17.5Pt—7B | 900 | 66 | 2.2% | 44.3 | 1100 | 7.7 |
| Example 9 | Co—17Cr—15.5Pt—9B | 1000 | 73 | 1.2% | 71.5 | 1500 | 9 |
| Example 10 | Co—14.5Cr—15Pt—7B | 1100 | 74 | 4.3% | 75.2 | 1400 | 10.1 |
| Example 11 | Co—10Cr—16Pt—2B | 700 | 76 | 4.1% | 30 | 10 | 10.8 |
| Example 12 | Co—20Cr—18Pt—2B | 800 | 70 | 4.9% | 42.6 | 200 | 5.7 |
| Example 13 | Co—15Cr—21.5Pt—8B | 1100 | 61 | 2.1% | 84.7 | 2100 | 8 |
| Example 14 | Co—6Cr—18.5Pt—2B | 1100 | 73 | 3.6% | 20.1 | 50 | 18.4 |
| Example 15 | Co—26Cr—13Pt—7B | 900 | 50 | 1.1% | 90 | 1400 | 0.3 |
| Example 16 | Co—1Cr—13.5Pt—7B | 900 | 67 | 2.9% | 78.9 | 1400 | 38.7 |
| Example 17 | Co—22.5Pt—7B | 1100 | 77 | 3.8% | 81.5 | 2100 | 39.5 |
| Example 18 | Co—4Cr—18Pt—6B—5Cu | 1070 | 69 | 4.4% | 58.9 | 1000 | 25.9 |
| Example 19 | Co—4Cr—18Pt—6B—0.5Cu | 1070 | 72 | 2.6% | 61.3 | 1100 | 29.7 |
| Example 20 | Co—15Cr—5Pt—5B—5Ru | 1100 | 80 | 6.0% | 75.6 | 1500 | 6.8 |
| Example 21 | Co—10Cr—12Pt—5B—1Ru | 1090 | 73 | 9.0% | 77.2 | 1400 | 12.5 |
| Example 22 | Co—12Cr—14Pt—6B—10Ru | 1100 | 76 | 1.6% | 80.1 | 1800 | 10.6 |
| Example 23 | Co—15Cr—8B—2Ta | 1100 | 72 | 2.9% | 87.6 | 2200 | 8.3 |
| Example 24 | Co—15Cr—12.5Pt—6B—1Ta | 1100 | 66 | 3.5% | 80.2 | 1300 | 7.7 |
| Example 25 | Co—20Cr—11Pt—49—1Nd | 1100 | 10 | 1.0% | 88.6 | 1200 | 3.4 |
| Example 26 | Co—10Cr—25Pt—5B | 1100 | 72 | 3.3% | 64.6 | 1300 | 9.8 |
| Example 27 | Co—10Cr—18Pt—15B | 1100 | 73 | 3.5% | 89.7 | 2500 | 10.5 |
| Example 28 | Co—40Cr—10Pt—1B | 1100 | 69 | 0.0% | 30.5 | 100 | 0.2 |
| Example 29 | Co—10Cr—1Pt—5B | 1080 | 71 | 4.6% | 68.9 | 1400 | 11.6 |
| Example 30 | Co—10Cr—30Pt—5B | 1100 | 70 | 2.8% | 78.9 | 1100 | 10.8 |
| Example 31 | Co—10Cr—16Pt—2B | 1090 | 72 | 10.0% | 25 | 200 | 7.8 |
| Example 32 | Co—13Cr—8Pt—4B | 1090 | 75 | 2.5% | 76.8 | 800 | 15.9 |
| Comparative Example 1 | Co—15Cr—14.5Pt—8B | 1090 | 62 | 4.8% | 111.7 | 4800 | 8.2 |
| Comparative Example 2 | Co—15Cr—17.5Pt—8B | 1090 | 72 | 4.1% | 112.4 | 4700 | 8.4 |

TABLE 1-continued

|  | Target Composition Ratio (at. %) | Heat Treatment (Annealing) Temperature (° C.) | Total Rolling Reduction of Primary Rolling (%) | Total Rolling Reduction of Secondary Rolling (%) | Average Grain Area of B-rich Phase ($\mu m^2$) | Cracks of B-rich Phase (crack/$mm^2$) | Maximum Magnetic Permeability ($\mu max$) |
|---|---|---|---|---|---|---|---|
| Comparative Example 3 | Co—15Cr—11Pt—12B | 1100 | 71 | 3.3% | 182.7 | 5300 | 11.1 |
| Comparative Example 4 | Co—14.5Cr—17Pt—8B | 1000 | 69 | 5.2% | 113.6 | 4800 | 9.3 |
| Comparative Example 5 | Co—14Cr—15.5Pt—10B | 1100 | 60 | 4.8% | 195.2 | 5200 | 11.5 |
| Comparative Example 6 | Co—14Cr—14Pt—6B | 800 | 75 | 3.1% | 118.7 | 4200 | 10.8 |
| Comparative Example 7 | Co—15Cr—17.5Pt—7B | 900 | 79 | 3.9% | 98.7 | 4400 | 9.1 |
| Comparative Example 8 | Co—16Cr—17.5Pt—7B | 900 | 53 | 2.0% | 93.9 | 4300 | 7.8 |
| Comparative Example 9 | Co—17Cr—15.5Pt—9B | 1000 | 76 | 1.2% | 111.2 | 5000 | 8.8 |
| Comparative Example 10 | Co—14.5Cr—15Pt—7B | 1100 | 72 | 4.2% | 107.5 | 4200 | 10.2 |
| Comparative Example 11 | Co—10Cr—16Pt—2B | 700 | 69 | 3.8% | 92.6 | 2600 | 10.4 |
| Comparative Example 12 | Co—20Cr—18Pt—2B | 800 | 71 | 4.9% | 94.3 | 2600 | 6.1 |
| Comparative Example 13 | Co—15Cr—21.5Pt—8B | 1100 | 64 | 2.1% | 151.2 | 5100 | 7.8 |
| Comparative Example 14 | Co—6Cr—18.5Pt—2B | 1100 | 72 | 3.6% | 91.6 | 2700 | 17.8 |
| Comparative Example 15 | Co—26Cr—13Pt—7B | 900 | 50 | 1.0% | 143.3 | 4500 | 0.4 |
| Comparative Example 16 | Co—1Cr—13.5Pt—7B | 900 | 69 | 2.7% | 102.3 | 5500 | 38.9 |
| Comparative Example 17 | Co—22.5Pt—7B | 1100 | 74 | 3.5% | 120.2 | 3900 | 39.7 |
| Comparative Example 18 | Co—4Cr—18Pt—6B—5Cu | 1070 | 70 | 4.3% | 92.4 | 2600 | 27.6 |
| Comparative Example 19 | Co—4Cr—18Pt—6B—0.5Cu | 1070 | 66 | 2.6% | 93.1 | 2700 | 28.8 |
| Comparative Example 20 | Co—15Cr—5Pt—5B—5Ru | 1100 | 82 | 5.8% | 94.5 | 2700 | 8.9 |
| Comparative Example 21 | Co—10Cr—12Pt—5B—1Ru | 1090 | 71 | 9.0% | 96.9 | 2900 | 12.3 |
| Comparative Example 22 | Co—12Cr—14Pt—6B—10Ru | 1100 | 76 | 1.5% | 98.8 | 3000 | 10.5 |
| Comparative Example 23 | Co—15Cr—8B—2Ta | 1100 | 70 | 2.9% | 103.4 | 4500 | 8 |
| Comparative Example 24 | Co—15Cr—12.5Pt—6B—1Ta | 1100 | 69 | 3.5% | 97.9 | 3700 | 7.8 |
| Comparative Example 25 | Co—20Cr—11Pt—4B—1Nd | 1100 | 11 | 1.0% | 120.1 | 3200 | 3.2 |
| Comparative Example 26 | Co—10Cr—25Pt—5B | 1100 | 67 | 3.0% | 94.8 | 3000 | 10.1 |
| Comparative Example 27 | Co—10Cr—18Pt—15B | 1100 | 63 | 3.4% | 162.3 | 5300 | 9.7 |
| Comparative Example 28 | Co—40Cr—10Pt—1B | 1100 | 74 | 0.0% | 91.2 | 2600 | 0.2 |
| Comparative Example 29 | Co—10Cr—1Pt—5B | 1080 | 73 | 4.5% | 100.3 | 2700 | 11.8 |
| Comparative Example 30 | Co—10Cr—30Pt—5B | 1100 | 69 | 2.8% | 106.7 | 2900 | 10.9 |
| Comparative Example 31 | Co—13Cr—8Pt—4B | 1090 | 75 | 0.0% | 92.6 | 120 | 51.2 |

Example 2

As shown in Table 1, the composition ratio was set to Co-15Cr-17.5Pt-8B, and a target was produced according to the same production process as Example 1. Here, the ingot size after casting was 180×300×36t. Moreover, the annealing temperature was set to 1090° C., the total rolling reduction of the primary rolling was set to 86%, and the total rolling reduction of the secondary rolling was set to 4.2%.

As a result of analyzing this target with the same method as Example 1, as shown in Table 1, the average grain area of the B-rich phase was 44.6 $\mu m^2$, and the number of cracks in the B-rich phase was 1500 cracks/$mm^2$. Moreover, the maximum magnetic permeability in the horizontal direction relative to the sputtering surface was 8.3.

Example 3

As shown in Table 1, the composition ratio was set to Co-15Cr-11Pt-12B, and a target was produced according to the same production process as Example 1. Here, the annealing temperature was set to 1100° C., the total rolling reduction of the primary rolling was set to 73%, and the total rolling reduction of the secondary rolling was set to 3.6%.

As a result of analyzing this target with the same method as Example 1, as shown in Table 1, the average grain area of the B-rich phase was 84.9 µm², and the number of cracks in the B-rich phase was 2000 cracks/mm². Moreover, the maximum magnetic permeability in the horizontal direction relative to the sputtering surface was 11.

Example 4

As shown in Table 1, the composition ratio was set to Co-14.5Cr-17Pt-8B, and a target was produced according to the same production process as Example 1. Here, the annealing temperature was set to 1000° C., the total rolling reduction of the primary rolling was set to 68%, and the total rolling reduction of the secondary rolling was set to 5.2%.

As a result of analyzing this target with the same method as Example 1, as shown in Table 1, the average grain area of the B-rich phase was 75.1 µm², and the number of cracks in the B-rich phase was 1100 cracks/mm². Moreover, the maximum magnetic permeability in the horizontal direction relative to the sputtering surface was 8.9.

Example 5

As shown in Table 1, the composition ratio was set to Co-14Cr-15.5Pt-10B, and a target was produced according to the same production process as Example 1. Here, the annealing temperature was set to 1100° C., the total rolling reduction of the primary rolling was set to 65%, and the total rolling reduction of the secondary rolling was set to 4.8%.

As a result of analyzing this target with the same method as Example 1, as shown in Table 1, the average grain area of the B-rich phase was 83.5 µm², and the number of cracks in the B-rich phase was 1900 cracks/mm². Moreover, the maximum magnetic permeability in the horizontal direction relative to the sputtering surface was 11.8.

Example 6

As shown in Table 1, the composition ratio was set to Co-14Cr-14Pt-6B, and a target was produced according to the same production process as Example 1. Here, the ingot size after casting was 180×300×36t. Moreover, the annealing temperature was set to 800° C., the total rolling reduction of the primary rolling was set to 80%, and the total rolling reduction of the secondary rolling was set to 3.2%.

As a result of analyzing this target with the same method as Example 1, as shown in Table 1, the average grain area of the B-rich phase was 74.3 µm², and the number of cracks in the B-rich phase was 900 cracks/mm². Moreover, the maximum magnetic permeability in the horizontal direction relative to the sputtering surface was 10.6.

Example 7

As shown in Table 1, the composition ratio was set to Co-15Cr-17.5Pt-7B, and a target was produced according to the same production process as Example 1. Here, the ingot size after casting was 180×300×36t. Moreover, the annealing temperature was set to 900° C., the total rolling reduction of the primary rolling was set to 78%, and the total rolling reduction of the secondary rolling was set to 3.9%.

As a result of analyzing this target with the same method as Example 1, as shown in Table 1, the average grain area of the B-rich phase was 50.1 µm², and the number of cracks in the B-rich phase was 1200 cracks/mm². Moreover, the maximum magnetic permeability in the horizontal direction relative to the sputtering surface was 9.2.

Example 8

As shown in Table 1, the composition ratio was set to Co-16Cr-17.5Pt-7B, and a target was produced according to the same production process as Example 1. Here, the annealing temperature was set to 900° C., the total rolling reduction of the primary rolling was set to 66%, and the total rolling reduction of the secondary rolling was set to 2.2%.

As a result of analyzing this target with the same method as Example 1, as shown in Table 1, the average grain area of the B-rich phase was 44.3 µm², and the number of cracks in the B-rich phase was 1100 cracks/mm². Moreover, the maximum magnetic permeability in the horizontal direction relative to the sputtering surface was 7.7.

Example 9

As shown in Table 1, the composition ratio was set to Co-17Cr-15.5Pt-9B, and a target was produced according to the same production process as Example 1. Here, the annealing temperature was set to 1000° C., the total rolling reduction of the primary rolling was set to 73%, and the total rolling reduction of the secondary rolling was set to 1.2%.

As a result of analyzing this target with the same method as Example 1, as shown in Table 1, the average grain area of the B-rich phase was 71.5 µm², and the number of cracks in the B-rich phase was 1500 cracks/mm². Moreover, the maximum magnetic permeability in the horizontal direction relative to the sputtering surface was 9.

Example 10

As shown in Table 1, the composition ratio was set to Co-14.5Cr-15Pt-7B, and a target was produced according to the same production process as Example 1. Here, the annealing temperature was set to 1100° C., the total rolling reduction of the primary rolling was set to 74%, and the total rolling reduction of the secondary rolling was set to 4.3%.

As a result of analyzing this target with the same method as Example 1, as shown in Table 1, the average grain area of the B-rich phase was 75.2 µm², and the number of cracks in the B-rich phase was 1400 cracks/mm². Moreover, the maximum magnetic permeability in the horizontal direction relative to the sputtering surface was 10.1.

Example 11

As shown in Table 1, the composition ratio was set to Co-10Cr-16Pt-2B, and a target was produced according to the same production process as Example 1. Here, the annealing temperature was set to 700° C., the total rolling reduction of the primary rolling was set to 76%, and the total rolling reduction of the secondary rolling was set to 4.1%.

As a result of analyzing this target with the same method as Example 1, as shown in Table 1, the average grain area of the B-rich phase was 30.0 µm², and the number of cracks in the B-rich phase was 10 cracks/mm². Moreover, the maximum magnetic permeability in the horizontal direction relative to the sputtering surface was 10.8.

Example 12

As shown in Table 1, the composition ratio was set to Co-20Cr-18Pt-2B, and a target was produced according to the same production process as Example 1. Here, the annealing temperature was set to 800° C., the total rolling reduction of the primary rolling was set to 70%, and the total rolling reduction of the secondary rolling was set to 4.9%.

As a result of analyzing this target with the same method as Example 1, as shown in Table 1, the average grain area of the B-rich phase was 42.6 μm$^2$, and the number of cracks in the B-rich phase was 200 cracks/mm$^2$. Moreover, the maximum magnetic permeability in the horizontal direction relative to the sputtering surface was 5.7.

Example 13

As shown in Table 1, the composition ratio was set to Co-15Cr-21.5Pt-8B, and a target was produced according to the same production process as Example 1. Here, the annealing temperature was set to 1100° C., the total rolling reduction of the primary rolling was set to 61%, and the total rolling reduction of the secondary rolling was set to 2.1%.

As a result of analyzing this target with the same method as Example 1, as shown in Table 1, the average grain area of the B-rich phase was 84.7 μm$^2$, and the number of cracks in the B-rich phase was 2100 cracks/mm$^2$. Moreover, the maximum magnetic permeability in the horizontal direction relative to the sputtering surface was 8.

Example 14

As shown in Table 1, the composition ratio was set to Co-6Cr-18.5Pt-2B, and a target was produced according to the same production process as Example 1. Here, the annealing temperature was set to 1100° C., the total rolling reduction of the primary rolling was set to 73%, and the total rolling reduction of the secondary rolling was set to 3.6%.

As a result of analyzing this target with the same method as Example 1, as shown in Table 1, the average grain area of the B-rich phase was 20.1 μm$^2$, and the number of cracks in the B-rich phase was 50 cracks/mm$^2$. Moreover, the maximum magnetic permeability in the horizontal direction relative to the sputtering surface was 18.4.

Example 15

As shown in Table 1, the composition ratio was set to Co-26Cr-13Pt-7B, and a target was produced according to the same production process as Example 1. Here, the annealing temperature was set to 900° C., the total rolling reduction of the primary rolling was set to 50%, and the total rolling reduction of the secondary rolling was set to 1.1%.

As a result of analyzing this target with the same method as Example 1, as shown in Table 1, the average grain area of the B-rich phase was 90.0 μm$^2$, and the number of cracks in the B-rich phase was 1400 cracks/mm$^2$. Moreover, the maximum magnetic permeability in the horizontal direction relative to the sputtering surface was 0.3.

Example 16

As shown in Table 1, the composition ratio was set to Co-1Cr-13.5Pt-7B, and a target was produced according to the same production process as Example 1. Here, the annealing temperature was set to 900° C., the total rolling reduction of the primary rolling was set to 67%, and the total rolling reduction of the secondary rolling was set to 2.9%.

As a result of analyzing this target with the same method as Example 1, as shown in Table 1, the average grain area of the B-rich phase was 78.9 μm$^2$, and the number of cracks in the B-rich phase was 1400 cracks/mm$^2$. Moreover, the maximum magnetic permeability in the horizontal direction relative to the sputtering surface was 38.7.

Example 17

As shown in Table 1, the composition ratio was set to Co-22.5Pt-7B, and a target was produced according to the same production process as Example 1. Here, the annealing temperature was set to 1100° C., the total rolling reduction of the primary rolling was set to 77%, and the total rolling reduction of the secondary rolling was set to 3.8%.

As a result of analyzing this target with the same method as Example 1, as shown in Table 1, the average grain area of the B-rich phase was 81.5 μm$^2$, and the number of cracks in the B-rich phase was 2100 cracks/mm$^2$. Moreover, the maximum magnetic permeability in the horizontal direction relative to the sputtering surface was 39.5.

Example 18

As shown in Table 1, the composition ratio was set to Co-4Cr-18Pt-6B-5Cu, and a target was produced according to the same production process as Example 1. Here, the annealing temperature was set to 1070° C., the total rolling reduction of the primary rolling was set to 69%, and the total rolling reduction of the secondary rolling was set to 4.4%.

As a result of analyzing this target with the same method as Example 1, as shown in Table 1, the average grain area of the B-rich phase was 58.9 μm$^2$, and the number of cracks in the B-rich phase was 1000 cracks/mm$^2$. Moreover, the maximum magnetic permeability in the horizontal direction relative to the sputtering surface was 25.9.

Example 19

As shown in Table 1, the composition ratio was set to Co-4Cr-18Pt-6B-0.5Cu, and a target was produced according to the same production process as Example 1. Here, the annealing temperature was set to 1070° C., the total rolling reduction of the primary rolling was set to 72%, and the total rolling reduction of the secondary rolling was set to 2.6%.

As a result of analyzing this target with the same method as Example 1, as shown in Table 1, the average grain area of the B-rich phase was 61.3 μm$^2$, and the number of cracks in the B-rich phase was 1100 cracks/mm$^2$. Moreover, the maximum magnetic permeability in the horizontal direction relative to the sputtering surface was 29.7.

Example 20

As shown in Table 1, the composition ratio was set to Co-15Cr-5Pt-5B-5Ru, and a target was produced according to the same production process as Example 1. Here, the ingot size after casting was 180×300×36t. Moreover, the annealing temperature was set to 1100° C., the total rolling reduction of the primary rolling was set to 80%, and the total rolling reduction of the secondary rolling was set to 6.0%.

As a result of analyzing this target with the same method as Example 1, as shown in Table 1, the average grain area of the B-rich phase was 75.6 μm$^2$, and the number of cracks in the B-rich phase was 1500 cracks/mm$^2$. Moreover, the maximum magnetic permeability in the horizontal direction relative to the sputtering surface was 6.8.

Example 21

As shown in Table 1, the composition ratio was set to Co-10Cr-12Pt-5B-1Ru, and a target was produced according to the same production process as Example 1. Here, the annealing temperature was set to 1090° C., the total rolling reduction of the primary rolling was set to 73%, and the total rolling reduction of the secondary rolling was set to 9.0%.

As a result of analyzing this target with the same method as Example 1, as shown in Table 1, the average grain area of the B-rich phase was 77.2 μm$^2$, and the number of cracks in the B-rich phase was 1400 cracks/mm$^2$. Moreover, the maximum magnetic permeability in the horizontal direction relative to the sputtering surface was 12.5.

Example 22

As shown in Table 1, the composition ratio was set to Co-12Cr-14Pt-6B-10Ru, and a target was produced according to the same production process as Example 1. Here, the ingot size after casting was 180×300×36t. Moreover, the annealing temperature was set to 1100° C., the total rolling reduction of the primary rolling was set to 76%, and the total rolling reduction of the secondary rolling was set to 1.6%.

As a result of analyzing this target with the same method as Example 1, as shown in Table 1, the average grain area of the B-rich phase was 80.1 μm$^2$, and the number of cracks in the B-rich phase was 1800 cracks/mm$^2$. Moreover, the maximum magnetic permeability in the horizontal direction relative to the sputtering surface was 10.6.

Example 23

As shown in Table 1, the composition ratio was set to Co-15Cr-8B-2Ta, and a target was produced according to the same production process as Example 1. Here, the annealing temperature was set to 1100° C., the total rolling reduction of the primary rolling was set to 72%, and the total rolling reduction of the secondary rolling was set to 2.9%.

As a result of analyzing this target with the same method as Example 1, as shown in Table 1, the average grain area of the B-rich phase was 87.6 μm$^2$, and the number of cracks in the B-rich phase was 2200 cracks/mm$^2$. Moreover, the maximum magnetic permeability in the horizontal direction relative to the sputtering surface was 8.3.

Example 24

As shown in Table 1, the composition ratio was set to Co-15Cr-12.5Pt-6B-1Ta, and a target was produced according to the same production process as Example 1. Here, the annealing temperature was set to 1100° C., the total rolling reduction of the primary rolling was set to 66%, and the total rolling reduction of the secondary rolling was set to 3.5%.

As a result of analyzing this target with the same method as Example 1, as shown in Table 1, the average grain area of the B-rich phase was 80.2 μm$^2$, and the number of cracks in the B-rich phase was 1300 cracks/mm$^2$. Moreover, the maximum magnetic permeability in the horizontal direction relative to the sputtering surface was 7.7.

Example 25

As shown in Table 1, the composition ratio was set to Co-20Cr-11Pt-4B-1Nd, and a target was produced according to the same production process as Example 1. Here, the annealing temperature was set to 1100° C., the total rolling reduction of the primary rolling was set to 10%, and the total rolling reduction of the secondary rolling was set to 1.0%.

As a result of analyzing this target with the same method as Example 1, as shown in Table 1, the average grain area of the B-rich phase was 88.6 μm$^2$, and the number of cracks in the B-rich phase was 1200 cracks/mm$^2$. Moreover, the maximum magnetic permeability in the horizontal direction relative to the sputtering surface was 3.4.

Example 26

As shown in Table 1, the composition ratio was set to Co-10Cr-25Pt-5B, and a target was produced according to the same production process as Example 1. Here, the annealing temperature was set to 1100° C., the total rolling reduction of the primary rolling was set to 72%, and the total rolling reduction of the secondary rolling was set to 3.3%.

As a result of analyzing this target with the same method as Example 1, as shown in Table 1, the average grain area of the B-rich phase was 64.6 μm$^2$, and the number of cracks in the B-rich phase was 1300 cracks/mm$^2$. Moreover, the maximum magnetic permeability in the horizontal direction relative to the sputtering surface was 9.8.

Example 27

As shown in Table 1, the composition ratio was set to Co-10Cr-18Pt-15B, and a target was produced according to the same production process as Example 1. Here, the annealing temperature was set to 1100° C., the total rolling reduction of the primary rolling was set to 73%, and the total rolling reduction of the secondary rolling was set to 3.5%.

As a result of analyzing this target with the same method as Example 1, as shown in Table 1, the average grain area of the B-rich phase was 89.7 μm$^2$, and the number of cracks in the B-rich phase was 2500 cracks/mm$^2$. Moreover, the maximum magnetic permeability in the horizontal direction relative to the sputtering surface was 10.5.

Example 28

As shown in Table 1, the composition ratio was set to Co-40Cr-10Pt-1B, and a target was produced according to the same production process as Example 1. Here, the annealing temperature was set to 1100° C., the total rolling reduction of the primary rolling was set to 69%, and the total rolling reduction of the secondary rolling was set to 0.0%.

As a result of analyzing this target with the same method as Example 1, as shown in Table 1, the average grain area of the B-rich phase was 30.5 μm$^2$, and the number of cracks in the B-rich phase was 100 cracks/mm$^2$. Moreover, the maximum magnetic permeability in the horizontal direction relative to the sputtering surface was 0.2. While the secondary rolling was not performed in this Example, a sufficiently low magnetic permeability was obtained since the percentage content of Cr was high.

Example 29

As shown in Table 1, the composition ratio was set to Co-10Cr-1Pt-5B, and a target was produced according to the same production process as Example 1. Here, the annealing temperature was set to 1080° C., the total rolling reduction of the primary rolling was set to 71%, and the total rolling reduction of the secondary rolling was set to 4.6%.

As a result of analyzing this target with the same method as Example 1, as shown in Table 1, the average grain area of the B-rich phase was 68.9 μm$^2$, and the number of cracks in the B-rich phase was 1400 cracks/mm$^2$. Moreover, the maximum magnetic permeability in the horizontal direction relative to the sputtering surface was 11.6.

Example 30

As shown in Table 1, the composition ratio was set to Co-10Cr-30Pt-5B, and a target was produced according to the same production process as Example 1. Here, the annealing temperature was set to 1100° C., the total rolling reduction of the primary rolling was set to 70%, and the total rolling reduction of the secondary rolling was set to 2.8%.

As a result of analyzing this target with the same method as Example 1, as shown in Table 1, the average grain area of the B-rich phase was 78.9 μm$^2$, and the number of cracks in the B-rich phase was 1100 cracks/mm$^2$. Moreover, the maximum magnetic permeability in the horizontal direction relative to the sputtering surface was 10.8.

Example 31

As shown in Table 1, the composition ratio was set to Co-10Cr-16Pt-2B, and a target was produced according to the same production process as Example 1. Here, the annealing temperature was set to 1090° C., the total rolling reduction of the primary rolling was set to 72%, and the total rolling reduction of the secondary rolling was set to 10.0%.

As a result of analyzing this target with the same method as Example 1, as shown in Table 1, the average grain area of the B-rich phase was 25.0 μm$^2$, and the number of cracks in the B-rich phase was 200 cracks/mm$^2$. Moreover, the maximum magnetic permeability in the horizontal direction relative to the sputtering surface was 7.8.

Example 32

As shown in Table 1, the composition ratio was set to Co-13Cr-8Pt-4B, and a target was produced according to the same production process as Example 1. Here, the annealing temperature was set to 1090° C., the total rolling reduction of the primary rolling was set to 75%, and the total rolling reduction of the secondary rolling was set to 2.5%.

As a result of analyzing this target with the same method as Example 1, as shown in Table 1, the average grain area of the B-rich phase was 76.8 μm$^2$, and the number of cracks in the B-rich phase was 800 cracks/mm$^2$. Moreover, the maximum magnetic permeability in the horizontal direction relative to the sputtering surface was 15.9.

In all of the Example, it was confirmed that the average grain area of the B-rich phase was 90 μm$^2$ or less and finely separated. When the B-rich phase is finely separated as described above, it was confirmed that the cracks in the B-rich phase could be suppressed to 2500 cracks/mm$^2$. Moreover, the maximum magnetic permeability ($\mu_{max}$) in the foregoing case was 50 or less. This kind of structure plays an extremely important role in order to suppress the amount of particles that are generated during sputtering, and improve the yield during deposition.

Comparative Example 1

A Co—Cr—Pt—B alloy raw material made from 15 at % of Cr, 14.5 at % of Pt, 8 at % of B, and remainder being Co and unavoidable impurities was subject to radio frequency (vacuum) melting. The resulting product was cast using a mold, which is configured by cobalt being set on a copper surface plate, at a temperature between melting point and melting point +100° C. to obtain an ingot of 200×300×30t.

Subsequently, the obtained ingot was subject to heat treatment at 1090° C., and thereafter subject to primary rolling at a total rolling reduction of 62%. In Comparative Example 1 and Comparative Examples 2 to 31 described later, hot rolling was performed as the primary rolling in all cases. Subsequently, the obtained rolled material was subject to secondary rolling at a total rolling reduction of 4.8%. The resulting product was machined to obtain a target.

The surface parallel to the sputtering surface of this target was observed at ten arbitrary visual fields (areas) of 190 μm×240 μm using an FE-EPMA (model number: JXA-8500F) electron microscope manufactured by JEOL. Consequently, the average grain area of the B-rich phase was 111.7 μm$^2$. Moreover, the number of cracks in the B-rich phase was counted and, as a result of obtaining the average value thereof and normalizing the same, the number of cracks in the B-rich phase was 4800 cracks/mm$^2$. In addition, as a result of measuring the maximum magnetic permeability ($\mu_{max}$) in the horizontal direction relative to the sputtering surface of this target using a B—H meter (BHU-6020) manufactured by Riken Denshi, the maximum magnetic permeability ($\mu_{max}$) was 8.2.

Comparative Example 2

As shown in Table 1, the composition ratio was set to Co-15Cr-17.5Pt-8B, and a target was produced according to the same production process as Comparative Example 1. Here, the annealing temperature was set to 1090° C., the total rolling reduction of the primary rolling was set to 72%, and the total rolling reduction of the secondary rolling was set to 4.1%.

As a result of analyzing this target with the same method as Comparative Example 1, as shown in Table 1, the average grain area of the B-rich phase was 112.4 μm$^2$, and the number of cracks in the B-rich phase was 4700 cracks/mm$^2$. Moreover, the maximum magnetic permeability in the horizontal direction relative to the sputtering surface was 8.4.

Comparative Example 3

As shown in Table 1, the composition ratio was set to Co-15Cr-11Pt-12B, and a target was produced according to the same production process as Comparative Example 1. Here, the annealing temperature was set to 1100° C., the total rolling reduction of the primary rolling was set to 71%, and the total rolling reduction of the secondary rolling was set to 3.3%.

As a result of analyzing this target with the same method as Comparative Example 1, as shown in Table 1, the average grain area of the B-rich phase was 182.7 μm$^2$, and the number of cracks in the B-rich phase was 5300 cracks/mm$^2$. Moreover, the maximum magnetic permeability in the horizontal direction relative to the sputtering surface was 11.1.

Comparative Example 4

As shown in Table 1, the composition ratio was set to Co-14.5Cr-17Pt-8B, and a target was produced according to the same production process as Comparative Example 1. Here, the annealing temperature was set to 1000° C., the total rolling reduction of the primary rolling was set to 69%, and the total rolling reduction of the secondary rolling was set to 5.2%.

As a result of analyzing this target with the same method as Comparative Example 1, as shown in Table 1, the average grain area of the B-rich phase was 113.6 μm$^2$, and the number of cracks in the B-rich phase was 4800 cracks/mm². Moreover, the maximum magnetic permeability in the horizontal direction relative to the sputtering surface was 9.3.

Comparative Example 5

As shown in Table 1, the composition ratio was set to Co-14Cr-15.5Pt-10B, and a target was produced according to the same production process as Comparative Example 1. Here, the annealing temperature was set to 1100° C., the total rolling reduction of the primary rolling was set to 60%, and the total rolling reduction of the secondary rolling was set to 4.8%.

As a result of analyzing this target with the same method as Comparative Example 1, as shown in Table 1, the average grain area of the B-rich phase was 195.2 μm², and the number of cracks in the B-rich phase was 5200 cracks/mm². Moreover, the maximum magnetic permeability in the horizontal direction relative to the sputtering surface was 11.5.

Comparative Example 6

As shown in Table 1, the composition ratio was set to Co-14Cr-14Pt-6B, and a target was produced according to the same production process as Comparative Example 1. Here, the annealing temperature was set to 800° C., the total rolling reduction of the primary rolling was set to 75%, and the total rolling reduction of the secondary rolling was set to 3.1%.

As a result of analyzing this target with the same method as Comparative Example 1, as shown in Table 1, the average grain area of the B-rich phase was 118.7 μm², and the number of cracks in the B-rich phase was 4200 cracks/mm². Moreover, the maximum magnetic permeability in the horizontal direction relative to the sputtering surface was 10.8.

Comparative Example 7

As shown in Table 1, the composition ratio was set to Co-15Cr-17.5Pt-7B, and a target was produced according to the same production process as Comparative Example 1. Here, the annealing temperature was set to 900° C., the total rolling reduction of the primary rolling was set to 79%, and the total rolling reduction of the secondary rolling was set to 3.9%.

As a result of analyzing this target with the same method as Comparative Example 1, as shown in Table 1, the average grain area of the B-rich phase was 98.7 μm², and the number of cracks in the B-rich phase was 4400 cracks/mm². Moreover, the maximum magnetic permeability in the horizontal direction relative to the sputtering surface was 9.1.

Comparative Example 8

As shown in Table 1, the composition ratio was set to Co-16Cr-17.5Pt-7B, and a target was produced according to the same production process as Comparative Example 1. Here, the annealing temperature was set to 900° C., the total rolling reduction of the primary rolling was set to 53%, and the total rolling reduction of the secondary rolling was set to 2.0%.

As a result of analyzing this target with the same method as Comparative Example 1, as shown in Table 1, the average grain area of the B-rich phase was 93.9 μm², and the number of cracks in the B-rich phase was 4300 cracks/mm². Moreover, the maximum magnetic permeability in the horizontal direction relative to the sputtering surface was 7.8.

Comparative Example 9

As shown in Table 1, the composition ratio was set to Co-17Cr-15.5Pt-9B, and a target was produced according to the same production process as Comparative Example 1. Here, the annealing temperature was set to 1000° C., the total rolling reduction of the primary rolling was set to 76%, and the total rolling reduction of the secondary rolling was set to 1.2%.

As a result of analyzing this target with the same method as Comparative Example 1, as shown in Table 1, the average grain area of the B-rich phase was 111.2 μm², and the number of cracks in the B-rich phase was 5000 cracks/mm². Moreover, the maximum magnetic permeability in the horizontal direction relative to the sputtering surface was 8.8.

Comparative Example 10

As shown in Table 1, the composition ratio was set to Co-14.5Cr-15Pt-7B, and a target was produced according to the same production process as Comparative Example 1. Here, the annealing temperature was set to 1100° C., the total rolling reduction of the primary rolling was set to 72%, and the total rolling reduction of the secondary rolling was set to 4.2%.

As a result of analyzing this target with the same method as Comparative Example 1, as shown in Table 1, the average grain area of the B-rich phase was 107.5 μm², and the number of cracks in the B-rich phase was 4200 cracks/mm². Moreover, the maximum magnetic permeability in the horizontal direction relative to the sputtering surface was 10.2.

Comparative Example 11

As shown in Table 1, the composition ratio was set to Co-10Cr-16Pt-2B, and a target was produced according to the same production process as Comparative Example 1. Here, the annealing temperature was set to 700° C., the total rolling reduction of the primary rolling was set to 69%, and the total rolling reduction of the secondary rolling was set to 3.8%.

As a result of analyzing this target with the same method as Comparative Example 1, as shown in Table 1, the average grain area of the B-rich phase was 92.6 μm², and the number of cracks in the B-rich phase was 2600 cracks/mm². Moreover, the maximum magnetic permeability in the horizontal direction relative to the sputtering surface was 10.4.

Comparative Example 12

As shown in Table 1, the composition ratio was set to Co-20Cr-18Pt-2B, and a target was produced according to the same production process as Comparative Example 1. Here, the annealing temperature was set to 800° C., the total rolling reduction of the primary rolling was set to 71%, and the total rolling reduction of the secondary rolling was set to 4.9%.

As a result of analyzing this target with the same method as Comparative Example 1, as shown in Table 1, the average grain area of the B-rich phase was 94.3 μm², and the number of cracks in the B-rich phase was 2600 cracks/mm². Moreover, the maximum magnetic permeability in the horizontal direction relative to the sputtering surface was 6.1.

Comparative Example 13

As shown in Table 1, the composition ratio was set to Co-15Cr-21.5Pt-8B, and a target was produced according to the same production process as Comparative Example 1. Here, the annealing temperature was set to 1100° C., the total rolling reduction of the primary rolling was set to 64%, and the total rolling reduction of the secondary rolling was set to 2.1%.

As a result of analyzing this target with the same method as Comparative Example 1, as shown in Table 1, the average grain area of the B-rich phase was 151.2 $\mu m^2$, and the number of cracks in the B-rich phase was 5100 cracks/$mm^2$. Moreover, the maximum magnetic permeability in the horizontal direction relative to the sputtering surface was 7.8.

Comparative Example 14

As shown in Table 1, the composition ratio was set to Co-6Cr-18.5Pt-2B, and a target was produced according to the same production process as Comparative Example 1. Here, the annealing temperature was set to 1100° C., the total rolling reduction of the primary rolling was set to 72%, and the total rolling reduction of the secondary rolling was set to 3.6%.

As a result of analyzing this target with the same method as Comparative Example 1, as shown in Table 1, the average grain area of the B-rich phase was 91.6 $\mu m^2$, and the number of cracks in the B-rich phase was 2700 cracks/$mm^2$. Moreover, the maximum magnetic permeability in the horizontal direction relative to the sputtering surface was 17.8.

Comparative Example 15

As shown in Table 1, the composition ratio was set to Co-26Cr-13Pt-7B, and a target was produced according to the same production process as Comparative Example 1. Here, the annealing temperature was set to 900° C., the total rolling reduction of the primary rolling was set to 50%, and the total rolling reduction of the secondary rolling was set to 1.0%.

As a result of analyzing this target with the same method as Comparative Example 1, as shown in Table 1, the average grain area of the B-rich phase was 143.3 $\mu m^2$, and the number of cracks in the B-rich phase was 4500 cracks/$mm^2$. Moreover, the maximum magnetic permeability in the horizontal direction relative to the sputtering surface was 0.4.

Comparative Example 16

As shown in Table 1, the composition ratio was set to Co-1Cr-13.5Pt-7B, and a target was produced according to the same production process as Comparative Example 1. Here, the annealing temperature was set to 900° C., the total rolling reduction of the primary rolling was set to 69%, and the total rolling reduction of the secondary rolling was set to 2.7%.

As a result of analyzing this target with the same method as Comparative Example 1, as shown in Table 1, the average grain area of the B-rich phase was 102.3 $\mu m^2$, and the number of cracks in the B-rich phase was 5500 cracks/$mm^2$. Moreover, the maximum magnetic permeability in the horizontal direction relative to the sputtering surface was 38.9.

Comparative Example 17

As shown in Table 1, the composition ratio was set to Co-22.5Pt-7B, and a target was produced according to the same production process as Comparative Example 1. Here, the annealing temperature was set to 1100° C., the total rolling reduction of the primary rolling was set to 74%, and the total rolling reduction of the secondary rolling was set to 3.5%.

As a result of analyzing this target with the same method as Comparative Example 1, as shown in Table 1, the average grain area of the B-rich phase was 120.2 $\mu m^2$, and the number of cracks in the B-rich phase was 3900 cracks/$mm^2$. Moreover, the maximum magnetic permeability in the horizontal direction relative to the sputtering surface was 39.7.

Comparative Example 18

As shown in Table 1, the composition ratio was set to Co-4Cr-18Pt-6B-5Cu, and a target was produced according to the same production process as Comparative Example 1. Here, the annealing temperature was set to 1070° C., the total rolling reduction of the primary rolling was set to 70%, and the total rolling reduction of the secondary rolling was set to 4.3%.

As a result of analyzing this target with the same method as Comparative Example 1, as shown in Table 1, the average grain area of the B-rich phase was 92.4 $\mu m^2$, and the number of cracks in the B-rich phase was 2600 cracks/$mm^2$. Moreover, the maximum magnetic permeability in the horizontal direction relative to the sputtering surface was 27.6.

Comparative Example 19

As shown in Table 1, the composition ratio was set to Co-4Cr-18Pt-6B-0.5Cu, and a target was produced according to the same production process as Comparative Example 1. Here, the annealing temperature was set to 1070° C., the total rolling reduction of the primary rolling was set to 66%, and the total rolling reduction of the secondary rolling was set to 2.6%.

As a result of analyzing this target with the same method as Comparative Example 1, as shown in Table 1, the average grain area of the B-rich phase was 93.1 $\mu m^2$, and the number of cracks in the B-rich phase was 2700 cracks/$mm^2$. Moreover, the maximum magnetic permeability in the horizontal direction relative to the sputtering surface was 28.8.

Comparative Example 20

As shown in Table 1, the composition ratio was set to Co-15Cr-5Pt-5B-5Ru, and a target was produced according to the same production process as Comparative Example 1. Here, the annealing temperature was set to 1100° C., the total rolling reduction of the primary rolling was set to 82%, and the total rolling reduction of the secondary rolling was set to 5.8%.

As a result of analyzing this target with the same method as Comparative Example 1, as shown in Table 1, the average grain area of the B-rich phase was 94.5 $\mu m^2$, and the number of cracks in the B-rich phase was 2700 cracks/$mm^2$. Moreover, the maximum magnetic permeability in the horizontal direction relative to the sputtering surface was 8.9.

Comparative Example 21

As shown in Table 1, the composition ratio was set to Co-10Cr-12Pt-5B-1Ru, and a target was produced according to the same production process as Comparative Example 1. Here, the annealing temperature was set to 1090° C., the total rolling reduction of the primary rolling was set to 71%, and the total rolling reduction of the secondary rolling was set to 9.0%.

As a result of analyzing this target with the same method as Comparative Example 1, as shown in Table 1, the average grain area of the B-rich phase was 96.9 µm², and the number of cracks in the B-rich phase was 2900 cracks/mm². Moreover, the maximum magnetic permeability in the horizontal direction relative to the sputtering surface was 12.3.

Comparative Example 22

As shown in Table 1, the composition ratio was set to Co-12Cr-14Pt-6B-10Ru, and a target was produced according to the same production process as Comparative Example 1. Here, the annealing temperature was set to 1100° C., the total rolling reduction of the primary rolling was set to 76%, and the total rolling reduction of the secondary rolling was set to 1.5%.

As a result of analyzing this target with the same method as Comparative Example 1, as shown in Table 1, the average grain area of the B-rich phase was 98.8 µm², and the number of cracks in the B-rich phase was 3000 cracks/mm². Moreover, the maximum magnetic permeability in the horizontal direction relative to the sputtering surface was 10.5.

Comparative Example 23

As shown in Table 1, the composition ratio was set to Co-15Cr-8B-2Ta, and a target was produced according to the same production process as Comparative Example 1. Here, the annealing temperature was set to 1100° C., the total rolling reduction of the primary rolling was set to 70%, and the total rolling reduction of the secondary rolling was set to 2.9%.

As a result of analyzing this target with the same method as Comparative Example 1, as shown in Table 1, the average grain area of the B-rich phase was 103.4 µm², and the number of cracks in the B-rich phase was 4500 cracks/mm². Moreover, the maximum magnetic permeability in the horizontal direction relative to the sputtering surface was 8.

Comparative Example 24

As shown in Table 1, the composition ratio was set to Co-15Cr-12.5Pt-6B-1Ta, and a target was produced according to the same production process as Comparative Example 1. Here, the annealing temperature was set to 1100° C., the total rolling reduction of the primary rolling was set to 69%, and the total rolling reduction of the secondary rolling was set to 3.5%.

As a result of analyzing this target with the same method as Comparative Example 1, as shown in Table 1, the average grain area of the B-rich phase was 97.9 µm², and the number of cracks in the B-rich phase was 3700 cracks/mm². Moreover, the maximum magnetic permeability in the horizontal direction relative to the sputtering surface was 7.8.

Comparative Example 25

As shown in Table 1, the composition ratio was set to Co-20Cr-11Pt-4B-1Nd, and a target was produced according to the same production process as Comparative Example 1. Here, the annealing temperature was set to 1100° C., the total rolling reduction of the primary rolling was set to 11%, and the total rolling reduction of the secondary rolling was set to 1.0%.

As a result of analyzing this target with the same method as Comparative Example 1, as shown in Table 1, the average grain area of the B-rich phase was 120.1 µm², and the number of cracks in the B-rich phase was 3200 cracks/mm². Moreover, the maximum magnetic permeability in the horizontal direction relative to the sputtering surface was 3.2.

Comparative Example 26

As shown in Table 1, the composition ratio was set to Co-10Cr-25Pt-5B, and a target was produced according to the same production process as Comparative Example 1. Here, the annealing temperature was set to 1100° C., the total rolling reduction of the primary rolling was set to 67%, and the total rolling reduction of the secondary rolling was set to 3.0%.

As a result of analyzing this target with the same method as Comparative Example 1, as shown in Table 1, the average grain area of the B-rich phase was 94.8 µm², and the number of cracks in the B-rich phase was 3000 cracks/mm². Moreover, the maximum magnetic permeability in the horizontal direction relative to the sputtering surface was 10.1.

Comparative Example 27

As shown in Table 1, the composition ratio was set to Co-10Cr-18Pt-15B, and a target was produced according to the same production process as Comparative Example 1. Here, the annealing temperature was set to 1100° C., the total rolling reduction of the primary rolling was set to 63%, and the total rolling reduction of the secondary rolling was set to 3.4%.

As a result of analyzing this target with the same method as Comparative Example 1, as shown in Table 1, the average grain area of the B-rich phase was 162.3 µm², and the number of cracks in the B-rich phase was 5300 cracks/mm². Moreover, the maximum magnetic permeability in the horizontal direction relative to the sputtering surface was 9.7.

Comparative Example 28

As shown in Table 1, the composition ratio was set to Co-40Cr-10Pt-1B, and a target was produced according to the same production process as Comparative Example 1. Here, the annealing temperature was set to 1100° C., the total rolling reduction of the primary rolling was set to 74%, and the total rolling reduction of the secondary rolling was set to 0.0%.

As a result of analyzing this target with the same method as Comparative Example 1, as shown in Table 1, the average grain area of the B-rich phase was 91.2 µm², and the number of cracks in the B-rich phase was 2600 cracks/mm². Moreover, the maximum magnetic permeability in the horizontal direction relative to the sputtering surface was 0.2.

Comparative Example 29

As shown in Table 1, the composition ratio was set to Co-10Cr-1Pt-5B, and a target was produced according to the same production process as Comparative Example 1. Here, the annealing temperature was set to 1080° C., the total rolling reduction of the primary rolling was set to 73%, and the total rolling reduction of the secondary rolling was set to 4.5%.

As a result of analyzing this target with the same method as Comparative Example 1, as shown in Table 1, the average grain area of the B-rich phase was 100.3 µm², and the number of cracks in the B-rich phase was 2700 cracks/mm². Moreover, the maximum magnetic permeability in the horizontal direction relative to the sputtering surface was 11.8.

Comparative Example 30

As shown in Table 1, the composition ratio was set to Co-10Cr-30Pt-5B, and a target was produced according to the same production process as Comparative Example 1. Here, the annealing temperature was set to 1100° C., the total rolling reduction of the primary rolling was set to 69%, and the total rolling reduction of the secondary rolling was set to 2.8%.

As a result of analyzing this target with the same method as Comparative Example 1, as shown in Table 1, the average grain area of the B-rich phase was 106.7 μm², and the number of cracks in the B-rich phase was 2900 cracks/mm². Moreover, the maximum magnetic permeability in the horizontal direction relative to the sputtering surface was 10.9.

Comparative Example 31

As shown in Table 1, the composition ratio was set to Co-13Cr-8t-4 and a target was produced according to the same production process as Comparative Example 1. Here, the annealing temperature was set to 1090° C., the total rolling reduction of the primary rolling was set to 75%, and the total rolling reduction of the secondary rolling was set to 0.0%.

As a result of analyzing this target with the same method as Comparative Example 1, as shown in Table 1, the average grain area of the B-rich phase was 92.6 μm², and the number of cracks in the B-rich phase was 120 cracks/mm². Moreover, the maximum magnetic permeability in the horizontal direction relative to the sputtering surface was 51.2.

While all Comparative Examples (excluding Comparative Example 31) had a maximum magnetic permeability ($\mu_{max}$) of 50 or less, they had a large B-rich phase having an average grain area that exceeds 90 μm². In cases where the B-rich phase was large as described above, the B-rich phase was subject to more than 2500 cracks/mm². This kind of structure causes the generation of arcing, causes the discharge during sputtering to be unstable, and increases the generation of nodules or particles.

The present invention yields a superior effect of being able to provide a sputtering target for a magnetic recording medium that has few cracks in the B-rich phase and has a high leakage flux density. It is thereby possible to stabilize the discharge during sputtering, suppress arcing which occurs from cracks in the B-rich phase, and effectively prevent or suppress the generation of nodules or particles. Moreover, the present invention yields a superior effect of being able to form a high quality film and considerably improve the production yield.

Since the sputtering target for a magnetic recording medium of the present invention possesses superior characteristics as described above, it is effective for forming a magnetic thin film for a magnetic recording medium, particularly a magnetic film of a hard disk.

The invention claimed is:

1. A sputtering target for magnetic recording medium obtained by rolling a Co—Cr—B-based ingot, wherein an average grain area of B-rich phase is 90 μm² or less, and wherein the sputtering target consists of 1 to 40 at % of Cr, 1 to 15 at % of B, 0 at % or 1 to 10 at % of one or more elements selected from Cu, Ru, and Nd, and remainder being Co.

2. The sputtering target for a magnetic recording medium according to claim 1, wherein a number of cracks in the B-rich phase is 2500 cracks/mm² or less.

3. The sputtering target for a magnetic recording medium according to claim 2, wherein the sputtering target has a maximum magnetic permeability (μmax) of 50 or less.

4. A process for producing a sputtering target for a magnetic recording medium, wherein a Co—Pt—B-based alloy cast ingot is subject to heat treatment, thereafter subject to hot rolling and cold rolling at a total rolling reduction of 10 to 90%, which includes at least one pass of cold rolling, to cause an average grain area of a B-rich phase to be 90 μm² or less, and thereafter machined to prepare a target, wherein the sputtering target consists of 1 to 26 at % of Pt, 1 to 15 at % of B, 0 at % or 1 to 10 at % of one or more elements selected from Cu, Ru, and Nd, and remainder being Co.

5. A process for producing a sputtering target for a magnetic recording medium, comprising the steps of:
    subjecting a Co—Pt—B-based alloy cast ingot to heat treatment;
    after the heat treatment, subjecting the ingot to primary rolling including hot rolling and cold rolling at a total rolling reduction of 10 to 90% which includes at least one pass of cold rolling;
    after the primary rolling, subjecting the ingot to secondary rolling including cold rolling at a total rolling reduction of 1.0 to 10% to cause an average grain area of a B-rich phase to be 90 μm² or less; and
    after secondary rolling, machining the ingot to produce a sputtering target;
    wherein the sputtering target consists of 1 to 26 at % of Pt, 1 to 15 at % of B, 0 at % or 1 to 10 at % of one or more elements selected from Cu, Ru, and Nd, and remainder being Co.

6. The process for producing a sputtering target for a magnetic recording medium according to claim 5, wherein an initial rolling of the primary rolling is hot rolling.

7. A process for producing a sputtering target for a magnetic recording medium, wherein a Co—Cr—Pt—B-based alloy cast ingot is subject to heat treatment, thereafter subject to hot rolling and cold rolling at a total rolling reduction of 10 to 90%, which includes at least one pass of cold rolling, to cause an average grain area of a B-rich phase to be 90 μm² or less, and thereafter machined to prepare a target, wherein the sputtering target consists of 1 to 40 at % of Cr, 1 to 26 at % of Pt, 1 to 15 at % of B, 0 at % or 1 to 10 at % of one or more elements selected from Cu, Ru, and Nd, and remainder being Co.

8. A process for producing a sputtering target for a magnetic recording medium, wherein a Co—Cr—B-based alloy cast ingot is subject to heat treatment, thereafter subject to hot rolling and cold rolling at a total rolling reduction of 10 to 90%, which includes at least one pass of cold rolling, to cause an average grain area of a B-rich phase to be 90 μm² or less, and thereafter machined to prepare a target, wherein the sputtering target consists of 1 to 40 at % of Cr, 1 to 15 at % of B, 0 at % or 1 to 10 at % of one or more elements selected from Cu, Ru, and Nd, and remainder being Co.

9. A process for producing a sputtering target for a magnetic recording medium, comprising the steps of:
    subjecting a Co—Cr—Pt—B-based alloy cast ingot to heat treatment;

after the heat treatment, subjecting the ingot to primary rolling including hot rolling and cold rolling at a total rolling reduction of 10 to 90% which includes at least one pass of cold rolling;

after the primary rolling, subjecting the ingot to secondary rolling including cold rolling at a total rolling reduction of 1.0 to 10% to cause an average grain area of a B-rich phase to be 90 $\mu m^2$ or less; and after secondary rolling, machining the ingot to produce a sputtering target;

wherein the sputtering target consists of 1 to 40 at % of Cr, 1 to 26 at % of Pt, 1 to 15 at % of B, 0 at % or 1 to 10 at % of one or more elements selected from Cu, Ru, and Nd, and remainder being Co.

10. The process for producing a sputtering target for a magnetic recording medium according to claim 9, wherein an initial rolling of the primary rolling is hot rolling.

11. A process for producing a sputtering target for a magnetic recording medium, comprising the steps of:

subjecting a Co—Cr—B-based alloy cast ingot to heat treatment;

after the heat treatment, subjecting the ingot to primary rolling including hot rolling and cold rolling at a total rolling reduction of 10 to 90% which includes at least one pass of cold rolling;

after the primary rolling, subjecting the ingot to secondary rolling including cold rolling at a total rolling reduction of 1.0 to 10% to cause an average grain area of a B-rich phase to be 90 $\mu m^2$ or less; and after secondary rolling, machining the ingot to produce a sputtering target;

wherein the sputtering target consists of 1 to 40 at % of Cr, 1 to 15 at % of B, 0 at % or 1 to 10 at % of one or more elements selected from Cu, Ru, and Nd, and remainder being Co.

12. The process for producing a sputtering target for a magnetic recording medium according to claim 11, wherein an initial rolling of the primary rolling is hot rolling.

* * * * *